United States Patent
Al-Mufti et al.

(10) Patent No.: US 12,429,507 B2
(45) Date of Patent: Sep. 30, 2025

(54) SYSTEM AND METHOD FOR DETERMINING CABLE RESISTANCE USING AT LEAST ONE ELECTRICAL PARAMETER MEASURED BY A RADIO

(71) Applicant: Outdoor Wireless Networks LLC, Claremont, NC (US)

(72) Inventors: Khalid W. Al-Mufti, Sterling, VA (US); Michael R Guerin, St Charles, IL (US); John T. Hanley, Orland Park, IL (US); David Winkler, Alexandria, VA (US)

(73) Assignee: Outdoor Wireless Networks LLC, Richardson, TX (US)

( * ) Notice: Subject to any disclaimer, the term of this patent is extended or adjusted under 35 U.S.C. 154(b) by 218 days.

(21) Appl. No.: 18/547,359

(22) PCT Filed: Jan. 26, 2022

(86) PCT No.: PCT/US2022/013816
§ 371 (c)(1),
(2) Date: Aug. 22, 2023

(87) PCT Pub. No.: WO2022/186918
PCT Pub. Date: Sep. 9, 2022

(65) Prior Publication Data
US 2024/0133933 A1    Apr. 25, 2024
US 2024/0230736 A9    Jul. 11, 2024

Related U.S. Application Data

(60) Provisional application No. 63/228,759, filed on Aug. 3, 2021, provisional application No. 63/157,133, filed on Mar. 5, 2021.

(51) Int. Cl.
| | | |
|---|---|---|
| *G01R 27/08* | (2006.01) |
| *G01R 27/16* | (2006.01) |
| *H02M 1/00* | (2007.01) |
| *H02M 3/156* | (2006.01) |

(52) U.S. Cl.
CPC ............ *G01R 27/08* (2013.01); *G01R 27/16* (2013.01); *H02M 1/0009* (2021.05); *H02M 3/156* (2013.01)

(58) Field of Classification Search
CPC ........ G01R 27/08; G01R 27/16; G01R 27/02; H02M 1/0009; H02M 3/156; H02M 1/0048; H02M 1/0025
See application file for complete search history.

(56) References Cited

U.S. PATENT DOCUMENTS 9,448,576 B2 *   9/2016   Chamberlain ........ H04W 52/00
10,812,664 B2   10/2020   Kostakis et al.
(Continued)

FOREIGN PATENT DOCUMENTS

WO    2022186918 A1    9/2022

OTHER PUBLICATIONS

Frenger et al., A technical look at 5G energy consumption and performance, Ericsson Blog, Sep. 17, 2019, as downloaded Jul. 3, 2023 from https://www.ericsson.com/en/blog/2019/9/energy-consumption-5g-nr, pp. 1 through 13.
(Continued)

*Primary Examiner* — Christopher E Mahoney
(74) *Attorney, Agent, or Firm* — Fogg & Powers LLC

(57) ABSTRACT

Techniques are provided for determining a resistance of radio power electrical conductors coupling a voltage converter to a radio using electrical parameter(s) obtained from the radio.

24 Claims, 3 Drawing Sheets

(56) References Cited

U.S. PATENT DOCUMENTS

| | | |
|---|---|---|
| 11,129,095 B2 | 9/2021 | Gandhi |
| 12,301,107 B2 * | 5/2025 | Hanley .................. H02M 3/04 |
| 2012/0069882 A1 | 3/2012 | Nino et al. |
| 2013/0051440 A1 | 2/2013 | Rofougaran |
| 2013/0127481 A1 | 5/2013 | Vladan |
| 2018/0176861 A1 | 6/2018 | Chamberlain et al. |
| 2018/0270750 A1 | 9/2018 | Coleman et al. |

OTHER PUBLICATIONS

Frenger et al., "Assessment of Alternatives for Reducing Energy Consumption in Multi-RAT Scenarios", 2014 IEEE 79th Vehicular Technology Conference (VTC Spring), Seoul, Korea (South), May 18-21, 2014, pp. 1 through 5.

Frenger et al., Radio network energy performance: Shifting focus from power to prediction, Ericsson Review, Feb. 2014, Feb. 18, 2014, pp. 1 through 10.

International Searching Authority, "International Search Report and Written Opinion", from PCT Application No. PCT/US2022/013816, May 9, 2022, pp. 1 through 9, Published: WO.

O-RAN Alliance, "O-RAN Working Group 4 (Open Fronthaul Interfaces WG) Control, User and Synchronization Plane Specification", O-RAN.WG4.CUS.0-R003-v12.00 Technical Specification, Published, Jun. 2023, pp. 1 through 395, (c) O-RAN Alliance.

O-RAN Alliance, "O-RAN Working Group 4 (Open Fronthaul Interfaces WG) Management Plane Specification", O-RAN.WG4.MP.0-R003-v12.00 Technical Specification, Published, Jun. 2023, pp. 1 through 283, (c) O-RAN Alliance.

* cited by examiner

SYSTEM AND METHOD FOR DETERMINING CABLE RESISTANCE USING AT LEAST ONE ELECTRICAL PARAMETER MEASURED BY A RADIO

CROSS-REFERENCE TO RELATED APPLICATIONS

The present application is a 371 National Stage Application of PCT Application No. PCT/US2022/013816 (filed Jan. 26, 2022) which claims benefit of U.S. Patent Application Ser. Nos. 63/157,133 (filed Mar. 5, 2021) and 63/228,759 (filed Aug. 3, 2021); the entire contents of each of the aforementioned patent applications are incorporated herein by reference as if set forth in their entirety.

BACKGROUND

A voltage converter may be used to increase the voltage provided on a power cable electrically coupling a direct current (DC) electrical power supply (or DC power supply) to a radio. By increasing the voltage provided to the power cable, current flow, and thus dissipative power loss, in the power cable is reduced. Techniques for doing so are described in U.S. Pat. No. 9,448,576, which is hereby incorporated by reference herein in its entirety. If the resistance of the power cable is known, upon measuring current flow in the power cable an increases voltage (or boost voltage) (provided by the boost converter) can be determined and which completely or partially offsets a voltage drop in the power cable due to the dissipative power loss. Both determination of the power cable resistance and entry of the determined power cable resistance for use by the voltage converter can be undesirably labor intensive.

SUMMARY

A voltage converter, comprising: input conductors configured to receive a DC voltage; output conductors; measurement circuitry electrically coupled to the output conductors and configured to measure current level flowing through the output conductors; conversion circuitry comprising an input electrically coupled to the input conductors and an output electrically coupled to the output conductors; and processing circuitry configured to: receive, from a radio electrically connected to the output conductors by radio power electrical conductors, at least one DC radio power consumption level or at least one DC voltage level at a DC power input of the radio, and a corresponding time when each DC radio power consumption level or DC voltage level was determined; receive at least one DC voltage level across the output conductors of the voltage converter and a corresponding time when each DC voltage level was determined; obtain at least one of: (a) a direct current drawn by the DC power input of the radio and (b) a direct current flowing through the output conductors of the voltage converter; identify at least one set of (a) a radio DC power consumption level, a DC voltage level across the output conductors, and at least one of the direct current drawn by the DC power input of the radio and the direct current flowing through the output conductors, or (b) a DC voltage level at the DC power input of the radio, a DC voltage level across the output conductors, and at least one of the direct current drawn by the DC power input of the radio and the direct current flowing through the output conductors, wherein for each set a difference between each of the time corresponding to when the radio DC power consumption level or DC voltage level at the DC power input of the radio was determined, the time when the a DC voltage level across the output conductors was determined, and the times when the at least one of the direct current drawn by the DC power input of the radio and the direct current flowing through the output conductors were determined are within a time window; determine a resistance of the radio power electrical conductors using the identified at least one set; determine a DC voltage level, configured to be provided at the output conductors, based upon the determined resistance and a current level measured by the measurement circuitry; and set the DC voltage level at the output conductors to be equal to the determined DC voltage level.

A method, comprising: receiving, from a radio electrically coupled to an output of a voltage converter by radio power electrical conductors, at least one DC radio power consumption level or at least one DC voltage level at a DC power input of the radio, and a corresponding time when each DC radio power consumption level or DC voltage level was determined; receiving, at least one DC voltage level across the output of the voltage converter and a corresponding time when each DC voltage level was determined; obtaining at least one of: (a) a direct current drawn by the DC power input of the radio and (b) a direct current flowing through the output of the voltage converter; identifying at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and determining a resistance of the radio power electrical conductors using the identified at least one set; wherein the determined resistance is configured to be used with a measured current flowing through the output of the voltage converter to determine a DC voltage level to be provided at an output of the voltage converter.

A program product comprising a processor readable non-transitory medium on which program instructions are embodied, wherein the program instructions are configured, when executed by at least one programmable processor, to cause the at least one programmable processor to: receive, from a radio electrically coupled to an output of a voltage converter by radio power electrical conductors, at least one DC radio power consumption or at least one DC voltage level at a DC power input of the radio, and a corresponding time when each DC radio power consumption level or DC voltage level was determined; receive, at least one DC voltage level at the output of the voltage converter and a corresponding time when each corresponding time was determined; obtain at least one of: (a) a direct current drawn by the DC power input of the radio and (b) a direct current flowing through the output of the voltage converter; identify at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and determine a resistance of the radio power electrical conductors using the identified at least one set, wherein the determined resistance is configured to be used with a measured current flowing through the output of the voltage converter to determine a DC voltage level to be provided at an output of the voltage converter.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1A:
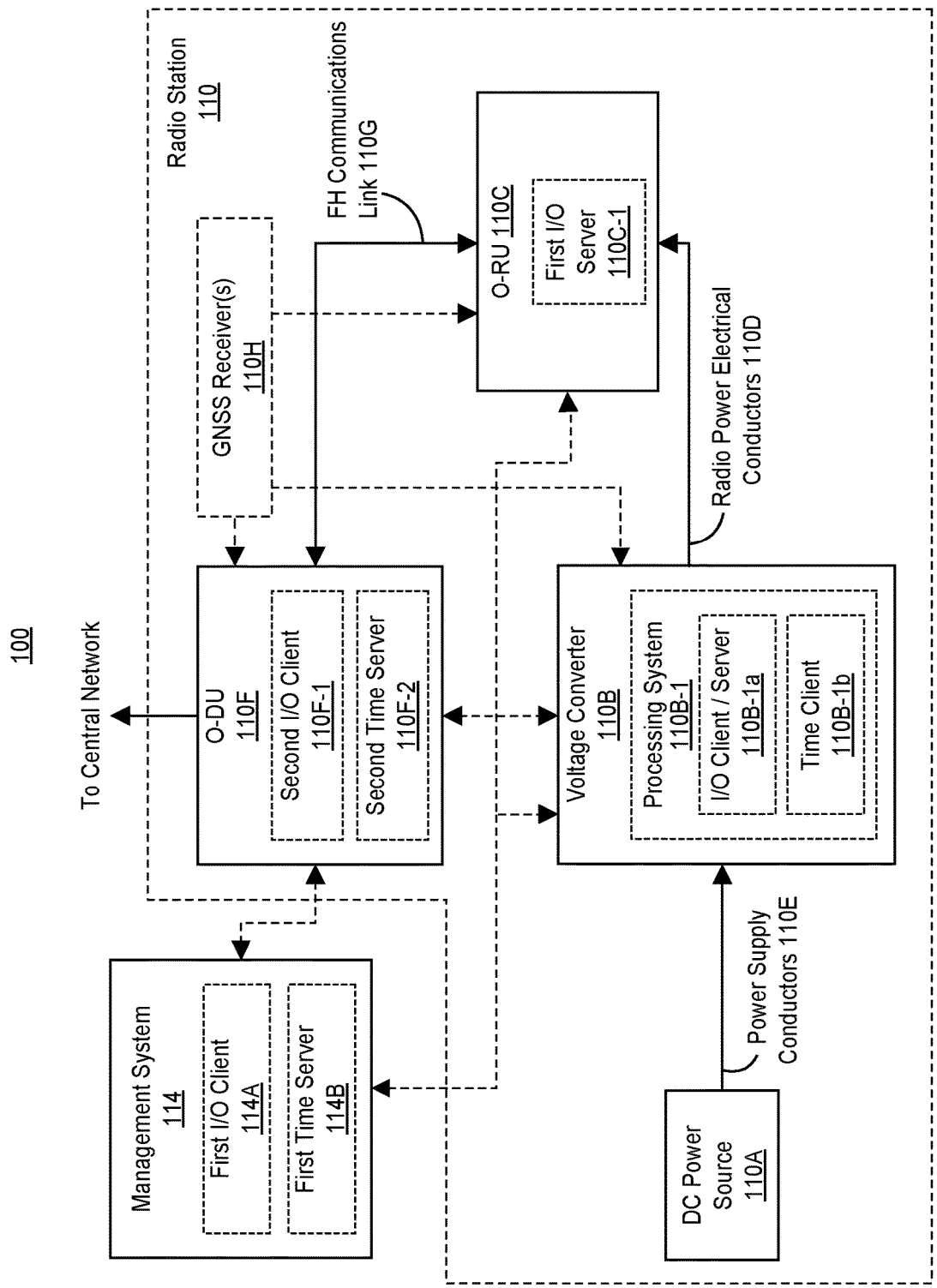
FIG. 1A illustrates one embodiment of a radio access network configured to determine a resistance of a radio power electrical conductors electrically coupling a voltage converter to a radio.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized, and that logical, mechanical, and electrical changes may be made without departing from the scope of the present invention. The following detailed description is, therefore, not to be taken in a limiting sense.

A radio power electrical connector means at least one electrical component, e.g., including at least one power cable and/or other electrical components, through which DC electrical power is provided from a voltage converter to a radio. Other electrical components may include at least one overvoltage protection circuit and/or at least one bus bar.

Embodiments of the present invention provide techniques for determining a resistance of a radio power electrical conductors by obtaining at least (a) DC electrical power (or DC power) consumed by, or a DC voltage provided to a DC power input of, a radio that receives the DC power from a DC power source through the radio power electrical conductors, and (b) a current drawn by the radio, e.g., supplied by the voltage converter, and a voltage supplied to the radio power electrical conductors by the voltage converter. A radio transmits and/or receives data at one or more frequencies translated above baseband. Radio as used herein describes a remote radio unit, remote radio head, radio antenna unit, or any other radio system. The radio may be part of a radio system such as a cellular base station, a distributed antenna system, a fixed wireless access system, or any other type of radio system. Exemplary communications technology will now be discussed.

Wireless communications service providers are deploying 5G radio access networks (RANs). Many of such 5G radio access networks are configured to satisfy the open radio access network (O-RAN) Alliance specifications ("O-RAN specifications"). The O-RAN specifications include without limitation the O-RAN fronthaul working group control, user and synchronization plane specification (ORAN-WG4.CUS.0-V04.00) and O-RAN Alliance working group 4 management plane specification (ORAN-WG4.MP.0-v04.00.00); the O-RAN specifications are hereby incorporated by reference herein in their entirety.

The O-RAN specifications permit interoperability of RAN components, e.g., O-RAN specification compliant radios (or O-RAN radio units or O-RAN radios) and an O-RAN specification compliant distributed units (or O-RAN distributed units), made by different vendors. The O-RAN distributed unit may be executed on a server system, e.g., local server network(s) and/or cloud computing system(s). The O-RAN specifications utilize message protocols to communicate between O-RAN compliant radios and O-RAN compliant virtual. A virtual baseband unit processes, e.g., encodes, baseband data received from and sent to radio(s). The virtual baseband unit and radio(s) are components of a communications system such as a cellular communications system and/or a fixed wireless access communications system that provides point to point communications. For purposes of clarity, the embodiments of the invention are illustrated as being implemented with a virtual baseband; however, the invention may be implemented with any type of baseband unit.

Communications between a radio and a virtual baseband unit are facilitated using an input/output (I/O) data protocol used by the radio and the virtual baseband unit. The I/O data protocol is a protocol used to convey messages, e.g., in a user plane, a control plane, a synchronization plane, and/or a management plane; however, one or more alternative planes may be used in lieu of the foregoing. IEEE 1914.3 compliant communications protocol, Common Public Radio Interface (CPRI), Enhanced CPRI (eCPRI) are examples of I/O data protocols; however, other I/O data protocols may be used.

Each message protocol has a format, i.e., a syntax with one or more variables. Data about at least one radio characteristic (e.g., DC power consumed by the radio, voltage at DC power input of the radio, and/or direct current drawn by the radio) may be obtained from a radio by sending it a message.[1]

[1] The current O-RAN standard includes obtaining radio DC power consumption measurements. Future versions of the O-RAN standard can be modified to include (as mandatory or optional) obtaining voltage of DC power input of a radio and/or direct current drawn by the radio at the DC power input of the radio.

Optionally, the virtual baseband unit is an O-DU; however, the virtual baseband unit may be another type of virtual base band unit. For pedagogical purposes, an O-DU is illustrated herein. However, embodiments of the invention are applicable to other types of virtual base band units. A virtual baseband unit means a baseband unit configured to be executed on server(s) and/or in a Cloud computing system, and to be communicatively coupled to at least one radio.

For pedagogical purposes, the radio may be illustrated herein is an O-RAN compliant radio unit (O-RU) and the virtual baseband unit illustrated herein is an O-RAN compliant distributed unit (O-DU). An O-RU is one example of a radio. The terms O-RU and radio may be subsequently used. However, in other embodiments of the invention, the radio and/or the virtual baseband unit can be compliant with other, and thus may not be an O-RU and/or an O-DU. Also, a baseband unit, i.e., a physical baseband unit, rather than a virtual baseband unit can be used in lieu of a virtual baseband unit.

Thus, the subsequently described radio access network is illustrated, for pedagogical purposes, as having 5G compliant RAN components, e.g., an O-DU and an O-RU. However, other embodiments of the invention may utilize RAN components conforming to standards, e.g., 5G and O-RAN, other than those exemplified herein.

FIG. 1A illustrates one embodiment of a radio access network (RAN) 100 configured to determine a resistance of a radio power electrical conductors electrically coupling a voltage converter to a radio. The RAN 100 comprises a radio station 110. Optionally, the RAN 100 further comprises a management system 114, e.g., a network management system, communicatively coupled to an O-DU 110F, and optionally, communicatively coupled to the radio station 110. The management system is configured to administer and/or manage the O-RU 110C.

In the 5G radio access network designed according to the O-RAN specifications, the radio station 110, e.g., a 5G base station (or gNB), includes an O-DU 110F configured to be coupled to at least one O-RU directly, and optionally through an optional fronthaul gateway (FHG), through fronthaul (FH) communications link 110G compliant with the O-RAN specifications. The fronthaul communications link 110G may be implemented with internet protocol and/or Ethernet networking technology. For pedagogical purposes, FIG. 1A illustrates a radio station 110 comprising a single O-RU 110C. Thus, the radio station 110 illustrated in FIG. 1A comprises an O-RU 110C, the O-DU 110F, a fronthaul communications link 110G, a radio power electrical conductors 110D, a voltage converter (or voltage converter circuitry) 110B, power supply conductors 110E, and a DC power source 110A. The voltage converter 110B is configured to boost an input DC voltage to a higher output DC voltage.

Downlink data sent to user equipment (wirelessly communicatively coupled to the O-RU 110C) is sent through the O-DU 110F (from the central network, through or not through an O-RAN compliant central unit (O-CU)) to the O-RU 110C. A central unit (CU) is discussed further elsewhere herein. Uplink data sent from such user equipment (wirelessly communicatively coupled to the O-RU 110C) is sent from the O-RU 110C through the O-DU 110F to the central network (through or not through an O-CU).

The O-DU is configured to host radio link control (RLC), medium access control, and physical (PHY) layers. Optionally, the O-DU is configured to host higher layer protocols, e.g., radio resource control, service data adaption protocol (SDAP), and packet data convergence protocol (PDCP); optionally, one or more of these services can be implemented in a central unit (CU). For a O-RAN compliant radio station, the CU may be an O-RAN compliant CU or O-CU; however, the radio, the virtual baseband unit, and the CU may be compliant with other standards and thus not be an O-CU. The O-DU is further configured to provide frequency domain baseband data, e.g., having in-phase and quadrature phase (I and Q) components. Thus, the O-DU has some functionality similar to 2G, 3G and/or 4G virtual baseband unit(s).

A data interface of the O-DU 110F (or O-DU interface) is configured to be coupled to either the central unit or a core network. The central unit is configured to be coupled between the O-RAN distributed unit and the core network. Optionally, the O-RAN distributed unit and/or the central unit are configured to be implemented in software executed on a server (or server circuitry) or a cloud computing system (or cloud computing system circuitry). Uplink and downlink data communicated through the O-DU interface comprises data in a user plane (U), a control plane (C), a synchronization plane (S), and/or a management plane (M). User plane data comprises voice and/or data transmitted to and from user equipment coupled to radio(s) of the RAN. Control plane data comprises messages used to control how a corresponding radio (receiving the control plane data) processes user plane In-phase and Quadrature-phase data stream in the uplink and downlink paths in real time. Synchronization plane data comprises data for synchronization and timing information between nodes (e.g., between a virtual baseband unit and a radio) of a RAN. Management plane data comprises data for operation, administration, and maintenance of radio(s), where such operation, administration, and maintenance is not required in real time. The control, synchronization, and/or management planes are bidirectional. Thus, a ping or a query sent in a one of the control, synchronization, and/or management plane in the downlink path may result in acknowledgement and/or responsive data the same plane in the uplink path.

Optionally, an O-RU 110C may be mounted on, e.g., at or near a top of, a mounting structure, e.g., a tower and/or another form of a mounting structure. DC power (or DC power) is electrically coupled from a DC power source 110A to the O-RU 110C through the voltage converter 110B. Optionally, the DC power source 110A comprises at least one of an alternating current (AC) to DC power supply and at least one battery. The DC power source 110A is electrically coupled to the voltage converter 110B through power supply conductors 110E. The power supply conductors 110E may be power cable(s), bus bar(s), wire(s) and/or other type of electrical conductors.

A manufacturer of a radio, exemplified hereafter as an O-RU 110C, may specify three input voltage ratings (provided where the radio power electrical conductors 110D are connected to the O-RU 110C, i.e., the DC power input of the O-RU 110C): a minimum required DC input voltage, a nominal DC input voltage, and a maximum DC input voltage. The O-RU 110C will not operate if provided a DC voltage, at its DC input power input, of less than the minimum required voltage. The O-RU 110C may fail or may not operate if provided a DC voltage at its DC power input of more than the maximum voltage. As used herein, nominal voltage means a voltage between the minimum required voltage and the maximum voltage. Note, some DC power sourcing systems are positive ground systems in which the nominal or recommended supply voltage is a negative value, such as negative 48V, and the return or common is ground and 0V. Herein, to avoid potential confusion, the voltage of a power signal will refer to the absolute value of the voltage difference between the supply conductor and the return conductor, regardless as to whether a positive ground or negative ground system is used. In other words, a first power signal having a voltage of 52V has a larger voltage than a second power signal having a voltage of 48V, even if the supply of the first power signal is −52V and the supply of the second power signal is −48V. Optionally, the voltage converter 110B may generate an output voltage that provides a voltage at a DC power input of the O-RU 110C between the nominal voltage and the maximum voltage of the O-RU 110C; for example, the voltage converter 110B may be operated to provide an output voltage so that the voltage at the DC power input of the O-RU 110C is less than the maximum voltage by at least a threshold voltage. The use of the threshold voltage reduces the likelihood that a transient voltage spike due to an abrupt, large change in current drawn by the O-RU 110C will generate a voltage at the DC power input in excess of the maximum voltage. Optionally, the threshold voltage may be a voltage within a range of 1 and five volts.

Conventionally, the voltage output of the power signal by the power supply ($V_{PS}$) has been set to ensure that a power signal having the nominal specified voltage is supplied to the remote radio head (or at least a value above the minimum required voltage for the power signal) when the remote radio head draws the maximum anticipated amount of current from the power supply.

The O-RU 110C comprises a first server 110C-1 (e.g., implemented in software executed on a processing system, e.g., processing circuitry) configured to provide data about the O-RU 110C automatically and/or upon request. In the event of the latter, the first input/output (I/O) server 110C-1 is configured to receive data from one or more I/O clients. Thus, client(s) and server(s) described herein are optional. The received data may be from other RAN components and used to program the O-RU 110C or may be requests for data from the O-RU 110C from the other components of the RAN 100. If a valid request for data is received at the first I/O server 110C-1, then the first I/O server 110C-1 supplies such data, e.g., to the requesting components of the RAN 100 or to another destination. A client may be located in a component of the RAN 100 or in a component that is not part of the RAN 100. Optionally, at least one of the management system 114, the O-DU 110F, and the voltage converter 110B comprises an I/O client. FIG. 1A illustrates, for pedagogical purposes, that the management system 114 comprises a first input/output (I/O) client 114A, that the O-DU 110F comprises a second I/O client 110F-1, and that the processing system (or processing circuitry) 110B-1 (of the voltage converter 110B) comprises a third I/O client or a second I/O server (I/O client or server, or I/O client/server) 110B-1a. The first I/O client 114A, the second I/O 110F-1, the first I/O client/server 110C-1, and the first I/O server 110C-1 are configured to communicate utilizing a data communications protocol. Optionally, the data communications protocol may be such as NETCONF/YANG, Simple Network Management Protocol, Command Line Interface, or any other data communications protocol capable of facilitating communications between networked devices. Optionally, communications between a server and a client are performed in the management plane.

Optionally, to ensure that measurements by the O-RU 110C and the voltage converter 110B are made at similar times, clocks of the voltage converter 110B, and at least one of the O-RU 110C and the management system 114, are synchronized. Optionally, the clocks may be implemented in processing systems of the voltage converter 110B, and of at least one of the O-RU 110C and a system that implements the management system 114. Optionally, such processing systems can be used also to execute the I/O client(s) 114A, 110F-1, 110B-1a and I/O server(s) 110B-1a, 110C-1.

Optionally, to synchronize time, the at least one of the management system 114 and the O-DU 110F comprise at least one time server (time server(s)) 114B, 110F-2, and the voltage converter 110B, e.g., the processing system 110B-1, comprises a cl 110B-1b. Optionally, the time server(s) 114B, 110F-2 are configured to obtain accurate time from at least one time source, e.g., at the U.S. National Institute of Standards and Technology, using network time protocols, and/or from global navigation satellite service (GNSS) receiver(s) (e.g., receiver(s) for global positioning satellite (GPS) system, BeiDou system, GLONASS system, Galileo system, and/or any other GNSS system). The time client 110B-1b is configured to obtain time from at least one of the time servers 114B, 110F-2. Additionally, or in the alternative to using time server(s) and a time client, the clocks of the voltage converter 110B (e.g., in the processing system 110B-1), and at least one of the O-RU 110C and the system that implements the management system 114 may be optionally synchronized from an external source, e.g., a GNSS or at least one time source such as a network time protocol server. Use of a GNSS will be illustrated for pedagogical purposes; the clocks of the voltage converter 110B, and at least one of the O-RU 110C and the system that implements the management system 114 may be optionally synchronized using time data from at least one GNSS receiver (GNSS receiver(s)) 110H. The GNSS receiver(s) 110H are illustrated as part of the radio station 110; however, at least one of the GNSS receiver(s) 110H may be external to the radio station 110, e.g., at another location of the radio access network or elsewhere, e.g., proximate to the processing system which executes the management system 114. Each GNSS receiver is configured to be communicatively coupled to one or more of the clocks of the voltage converter 110B, and at least one of the O-RU 110C and the system that implements the management system 114. Such techniques ensure that timing data corresponding to when electrical parameter data (DC power level(s), DC voltage level(s), and/or direct current level(s)) was obtained by the voltage converter 110B and the O-RU 110C is accurate, e.g., to within one millisecond.

Typically, timing of components in the RAN 100, e.g., the O-DU 110F and the O-RU 110C, is synchronized within one hundred nanoseconds or less, using synchronous Ethernet (SynchE) or precision time protocol (PTP); this ensures that downlink data is sent at a scheduled time. Thus, SynchE or PTP may be used lieu of or in addition to the other time synchronization alternatives described herein. SynchE is compliant with International Telecommunications Union (ITU) Telecommunication standardization sector recommendations G.8261, G.8262, and G.8264. PTP is compliant with Institute of Electrical and Electronics Engineers (IEEE) standard 1588. Thus, the time client 110B-1b may be used to derive similar time accuracy, using which ever technique (SynchE or PTP) is used by the RAN, so that it can be synchronized in time with the O-RU 110C (through at least one of the communications link(s) with component(s) (e.g., the management system 114, the O-DU 110F, and/or the O-RU 110C) of the RAN 110). Thus, using at least one of the synchronization techniques, data obtained at similar times by the voltage converter 110B and the O-RU 110C (which are physically distant from one another) can be used as described herein, e.g., to determine a resistance of radio power electrical conductors 110D.

Figure 1B:
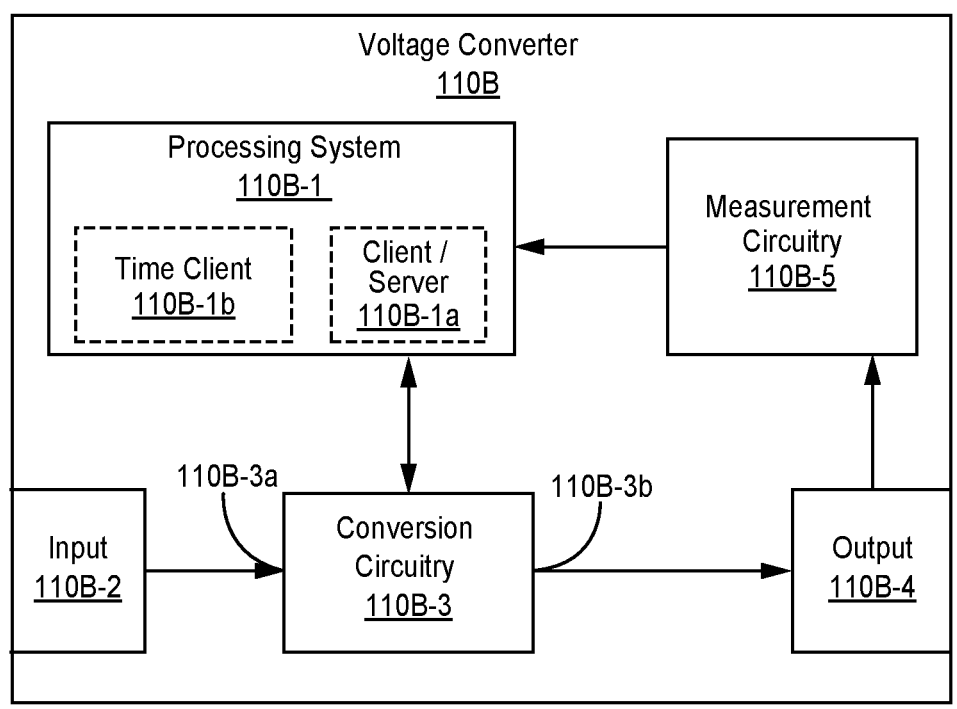
FIG. 1B illustrates a block diagram of one embodiment of the voltage converter.

FIG. 1B illustrates a block diagram of one embodiment of the voltage converter 110B. The illustrated voltage converter 110B comprises the processing system 110B-1, measurement circuitry 110B-5, an input (or input conductors) 110B-

2, conversion circuitry 110B-3, and an output (or output conductors) 110B-4. The input 110B-2 is configured to receive a first DC voltage from the DC power source 110A.

The conversion circuitry 110B-3 comprises an input 110B-3a electrically coupled to the input 110B-2 and an output 110B-3b electrically coupled to the output 110B-4. The conversion circuitry 110B-3 is configured to receive the first DC voltage from the input 110B-2 and to generate a second DC voltage. The conversion circuitry 110B-3 may generate a second DC voltage that has a fixed voltage level or a second DC voltage that has a variable voltage level. Optionally, the conversion circuitry 110B-3 generates a second DC voltage having a variable voltage level based upon at least one of: the received first DC voltage, a resistance of the radio power electrical conductors 110D, and current flow through the radio power electrical conductors 110D, e.g., the resistance of the radio power electrical conductors 110D and current flow through the radio power electrical conductors 110D. The conversion circuitry 110B-3 provides the second DC voltage to the output 110B-4. Optionally, the conversion circuitry 110B-3 may be implemented with a DC-DC voltage converter circuitry, e.g., a boost converter or a buck-boost converter.

The measurement circuitry 110B-5 comprises current measurement circuitry and optionally voltage measurement circuitry. The measurement circuitry 110B-5 comprises at least one input electrically coupled to the output 110B-4 and at least one output electrically coupled to at least one input of the processing system 110B-1. The measurement circuitry 110B-5 is configured to measure at least current flow through the output 110B-4. Optionally, the measurement circuitry 110B-5 is configured to also measure voltage at the output 110B-4. Optionally, the processing system 110B-1 comprises the I/O client/server 110B-1a. However, the I/O client 110B-1a may be located in another processing system of the voltage converter 110B, or there may be not I/O client in the voltage converter 110B.

Figure 2:
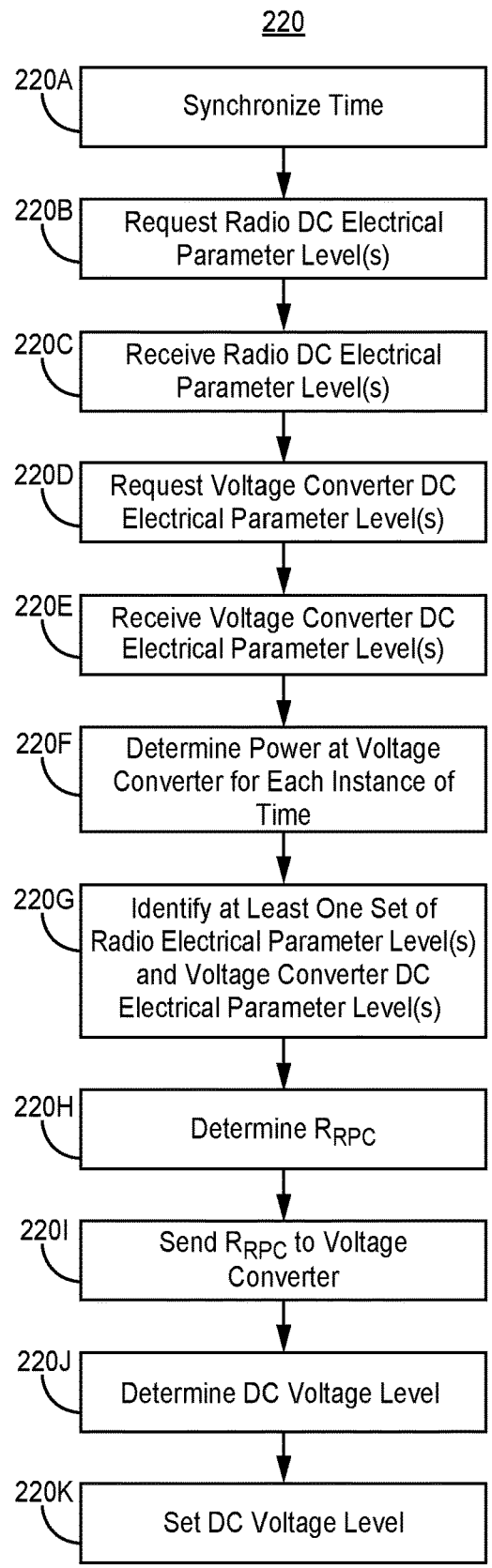
FIG. 2 illustrates a flow diagram of one embodiment of a method of determining a resistance of a radio power electrical conductors.

FIG. 2 illustrates a flow diagram of one embodiment of a method 220 of determining a resistance of a radio power electrical conductors. The blocks of the flow diagram have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner). Optionally, the method 220 is performed by the processing system 110B-1 in the voltage converter 110, however, the method 220 may be implemented by a processing system (or processing circuitry) elsewhere in the voltage converter 110B, or in another component of the RAN 100 or outside of the RAN 100 (e.g., in a server (or server circuitry) or a cloud computing system (or clouding computing circuitry)).

Optionally, in block 220A, time is synchronized. Thus, time kept by the voltage converter, e.g., by the processing system 110B-1, is synchronized with time kept by the radio, e.g., O-RU 110C. Optionally, the voltage converter, e.g., by the processing system 110B-1, receives time data, e.g., from a time server or another source, e.g., a GNSS receiver, with which to synchronize time maintained by the processing circuitry with time maintained by the radio. Optionally, time of the processing system 110B-1 of the voltage converter 110B, e.g., kept by a clock in the processing system 110B-1, is synchronized with time (or timing) of the radio station 110 or the radio access network which includes the radio station 110. Optionally, alternatively or additionally, time of the processing system 110B-1 and at least one component of the radio station 110 and/or the radio access network including the radio station 110 are synchronized using an external source, e.g., a GNSS or at least one time source such as a network time protocol server. Such techniques are described in further detail elsewhere herein.

Optionally, in block 220B, at least one DC electrical parameter level (DC electrical parameter level(s)) at a DC input of the radio (comprising at least one of: (a) at least one DC radio power level consumed by a radio at a unique instance of time or (b) at least one DC voltage level at the DC power input of the radio at a unique instance of time, and optionally (c) at least one direct current level drawn by the radio (through the DC power input of the radio) at a unique instance of time) is requested from the radio. The at least one DC electrical parameter level (DC electrical parameter level(s)) at a DC input of the radio may also be referred to as the radio DC electrical parameter level(s). Thus, for a unique instance of time, at least one DC radio power or at least one DC voltage level is requested, and optionally direct current level may be requested for the unique instance of time. If direct current level(s) are requested in addition to DC power level(s) and/or DC voltage level(s), then optionally the direct current level(s) would be measured within a first time window of the underlying measurements of the DC power level(s) and/or the DC voltage level(s) so that each current level is a current drawn by the radio substantially when the radio was consuming a corresponding DC power level and/or DC voltage level; this permits determination of resistance of the radio power electrical conductors. Optionally, the request is from an I/O client in a component of a RAN 100, e.g., an I/O client in the management system 114 or the processing system 110B-1 of the voltage converter, or a component that is not part of the RAN 100, e.g., from a cloud computing system. Optionally, such request is made over a management plane.

The first time window may be set by a system designer and/or user. Optionally, the first time window width or first time threshold may range from zero to five milliseconds; however, different ranges may be utilized. Time window means an interval of time.

In block 220C, the radio electrical parameter level(s) (comprising at least one of: (a) the at least one DC radio power consumption level at a unique instance of time or (b) the at least one DC voltage level at the DC power input of the radio at a unique instance of time, and optionally (c) the at least one direct current level drawn by the DC power input of the radio at a unique instance of time) with corresponding time(s) are received. Each corresponding time indicates a time when a corresponding electrical parameter level was determined, e.g., measured. Optionally, whether the at least one DC radio power consumption level or at least one DC voltage level, and the optional direct current level, are received depends upon whether they were requested. Optionally, more than one DC radio electrical parameter level is received for different determination times; each of the more than one DC radio electrical parameter levels is received with the corresponding determination time of the DC radio electrical parameter level. Optionally, the DC radio electrical parameter level(s) and corresponding time(s) are received by the requesting I/O client. Optionally, the received time has millisecond precision. Optionally, such received DC radio power and measurement time are made over a management plane. Optionally, the DC radio electrical parameter level(s) may be provided once or more than once (periodically or aperiodically) from the radio without a request being submitted. Optionally, the DC radio electrical parameter level(s) are received at a component of a RAN 100, e.g., an I/O client in the management system 114 or the processing system 110B-1 of the voltage converter, or a component that is not part of the RAN 100, e.g., at a cloud computing system. In block 220C, the radio electrical parameter level(s) (comprising at least one of: (a) the at least one DC radio power consumption level at a unique instance of time or (b) the at least one DC voltage level at the DC power input of the radio at a unique instance of time, and optionally (c) the at least one direct current level drawn by the DC power input of the radio at a unique instance of time) with corresponding time(s) are received. Each corresponding time indicates a time when a corresponding electrical parameter level was determined, e.g., measured. Optionally, whether the at least one DC radio power consumption level or at least one DC voltage level, and the optional direct current level, are received depends upon whether they were requested. Optionally, more than one DC radio electrical parameter level is received for different determination times; each of the more than one DC radio electrical parameter levels is received with the corresponding determination time of the DC radio electrical parameter level. Optionally, the DC radio electrical parameter level(s) and corresponding time(s) are received by the requesting I/O client. Optionally, the received time has millisecond precision. Optionally, such received DC radio power and measurement time are made over a management plane. Optionally, the DC radio electrical parameter level(s) may be provided once or more than once (periodically or aperiodically) from the radio without a request being submitted. Optionally, the DC radio electrical parameter level(s) are received at a component of a RAN 100, e.g., an I/O client in the management system 114 or the processing system 110B-1 of the voltage converter, or a component that is not part of the RAN 100, e.g., at a cloud computing system.

Optionally, in block 220D, for at least one unique instance of time, at least one DC electrical parameter at a DC power output, e.g., the output conductors, of the voltage converter (comprising a DC voltage level and a current level at the DC power output of a voltage converter or a DC power provided at the output of the voltage converter, and optionally a direct current level flowing through the output of the voltage converter) is requested. The at least one DC electrical parameter at an output of the voltage converter may also be referred to as voltage converter DC electrical parameter level(s). The direct current level flowing through the DC power output of the voltage converter must be requested in block 220D if a direct current level drawn by the DC power input of the radio for a corresponding time was not requested in block 220C.

As is illustrated elsewhere herein, resistance of the radio power electrical conductors can be determined using (a) either (i) a difference between DC power level at the DC power output of the voltage converter 110B and a DC power level at the DC power input of the radio or (ii) a difference between a DC voltage level at the DC power output of the voltage converter 110B and a DC voltage level at the DC input of the radio, and (b) a current drawn from the DC power output of the voltage converter 110B through the radio power electrical conductors 110D and into the DC power input of the radio. Such DC voltage or DC power level(s) and direct current level(s), used to determine cable resistance, optionally are measured within the first time window as discussed elsewhere herein—unless all such levels are maintained constant over a period of time in which electrical parameter values are used to determine cable resistance.

Optionally, the DC power, e.g., provided at the DC power output of the voltage converter or at the DC power input of the radio, by multiplying a corresponding DC voltage level with a direct current level, where the DC voltage level and current level are determined within the first time window (e.g., at the same time or otherwise proximate times). If both DC voltage level and direct current level are requested in block 220D, then the DC voltage level and the direct current level provided in response to a request for those two parameters may optionally be determined at the same or different times (albeit within the first time window) so that the product of the DC voltage level and direct current level reflects a substantially accurate representation of a corresponding DC power, as the case may be, output by the voltage converter 110B or received at a DC input of the radio. Optionally, the request is from the I/O client in a component of a RAN 100, e.g., an I/O client in the processing system 110B-1 of the voltage converter, in the management system 114, or in a component that is not part of the RAN 100 (e.g., a cloud computing system). Unique time instance means that an absolute difference, of a time when the DC voltage level of a pair is determined and a time when the current level of the pair is determined, is within a first time window, e.g., less than or equal to a first time threshold.

Optionally, in block 220E, voltage converter DC electrical parameter(s) (comprising a DC voltage level at the output of a voltage converter or a DC power provided at the output of the voltage converter, and optionally a direct current level flowing through the output of the voltage converter) with corresponding time(s) are received. Each corresponding time indicates a time when a corresponding electrical parameter level was determined, e.g., measured. Optionally, the received DC voltage level or DC power level, and the received direct current level are the DC voltage level and the optional direct current level are determined within the first time window The DC voltage level at the output of the voltage converter may be measured at the output conductors 110B-4 by a voltage sensor (or voltage measurement circuitry) or may be a DC voltage level provided to or determined by the voltage converter 110B, e.g., the processing system 110B-1. The direct current level flowing through the output of the voltage converter may also be measured by a current sensor (or current measurement circuitry) that measures direct current flowing through the output conductors 110B-4. Optionally, each time corresponding to a pair has millisecond precision. If block 220D is being performed by the voltage converter 110B, then the voltage converter 110B determines the DC voltage level and the direct current level, at the output of the voltage converter, of each pair and for each time instance—as described elsewhere herein. Optionally, such data is received by the I/O client in a component of a RAN 100, e.g., an I/O client in the voltage converter 110B or in the management system 114, or by an I/O client in a component that is not part of the RAN 100, e.g., a cloud computing system; the client receiving such data may be an I/O client that did not request the data.

Optionally, in block 220F, DC power provided at the output of the voltage converter is determined for at least one pair of a DC voltage level and current level(s) at the DC power output of the voltage converter using a DC voltage level measured at the output of the voltage converter and direct current level(s) measured flowing through the output of the voltage converter and/or through the DC power input of the radio, where the measured DC voltage level and the direct current level(s) were measured within a first time window. The DC power is determined by multiplying the DC voltage level by the direct current level (or a function, e.g., an average, of current levels measured at the voltage converter and the radio).

In block 220G, at least one set of (a) the radio DC electrical parameter level(s)[2] and (b) the voltage converter DC electrical parameter level(s)[3] are identified, where for each set a difference, between (i) the time corresponding to when the radio DC electrical parameter level(s) were measured or determined and (ii) the time corresponding to when the voltage converter DC electrical parameter level(s) were measured or determined are within a second time window, e.g., less than or equal to a second time threshold. At least one of the radio DC electrical parameter level(s) and the voltage converter DC electrical parameter level(s) comprises a direct current level. Optionally, the absolute value of the difference may be determined so that whether the absolute value of the difference is within the second time window is ascertained. The time window may be set by a system designer and/or user. Optionally, the absolute value of the difference may be determined so that whether the absolute value of the difference is within the second time window is ascertained. Optionally, the second time window width or second time threshold may range from zero to five milliseconds; however, different ranges may be utilized. The first and second time windows may be the same or different.

[2]E.g., (a) DC radio power level consumed by a radio at a unique instance of time or (b) at least one DC voltage level at the DC power input of the radio at a unique instance of time, and (c) optionally at least one direct current level drawn by the radio (through the DC power input of the radio) at a unique instance of time.

[3]E.g., (a) DC voltage at the output of the voltage converter, direct current flowing through the output of the voltage converter, and/or DC power provided at the output of the voltage converter.

In block 220H, a resistance of a radio power electrical conductors, $R_{RPC}$, is determined using at least one identified set of (a) the radio DC electrical parameter level(s)[4] and (b) the voltage converter DC electrical parameter level(s)[5]. Optionally, if power levels are used to determine $R_{RPC}$, then $R_{RPC}=(\Sigma_1^n((V_{VC_n}I_n-P_{R_n})/I_n^2))/n$, where n is a number of sets of received radio DC power consumption, voltage converter output DC voltage, and radio DC current consumption and/or voltage converter current output measurements, and thus is an integer greater than zero, $P_{R_n}$ is an $n^{th}$ received radio DC power consumption, $V_{VC_n}$ is an $n^{th}$ DC voltage at the output of the voltage converter, and $I_n$ is an $n^{th}$ direct current determined to be flowing from (or through) the output of the voltage converter, determined to be flowing into the DC power input of the radio, or a function of both of the foregoing currents. Optionally, if voltage levels are used to determine $R_{RPC}$, then $R_{RPC}=(\Sigma_1^n((V_{VC_n}-V_{R_n})/I_n))/n$, $V_{R_n}$ is a $n^{th}$ DC voltage at the DC power input of the radio. n is an integer greater than zero. Optionally, $R_{RPC}$ may be determined by determining an average of a set of resistances, and wherein each resistance of the set is determined from each identified set. $R_{RPC}$ may be determined in other ways, e.g., by calculating a resistance for each set, and selecting a median of the calculated resistances.

[4]E.g., (a) DC radio power level consumed by a radio at a unique instance of time or (b) at least one DC voltage level at the DC power input of the radio at a unique instance of time, and (c) optionally at least one direct current level drawn by the radio (through the DC power input of the radio) at a unique instance of time.

[5]E.g., (a) DC voltage at the output of the voltage converter, direct current flowing through the output of the voltage converter, and/or DC power provided at the output of the voltage converter.

Optionally, in block 220I, the determined resistance of a radio power electrical conductors can be sent to the voltage converter. Optionally, the resistance of a radio power electrical conductors is stored in the processing system, e.g., in a register or a database, of the voltage converter.

Optionally, a network function, e.g., executed on a cloud computing system or other processing system communicatively coupled to radio through management system 114, is configured to send a request for radio input DC voltage, radio DC power consumption, and/or DC input current level(s) to the radio, e.g., in the management plane, at or about the same instance the network function requests that the voltage converter 110B, e.g., the processing system 110B-1, obtain voltage converter output DC voltage level(s) and optionally output direct current levels(s), and corresponding time(s) when such level(s) were obtained. Optionally, the radio sends the requested radio DC power consumption, radio input DC voltage, and/or radio input direct current level(s) of the radio to the voltage converter 110B, e.g., the processing system 110B-1. Optionally, the voltage converter 110B, e.g., the processing system 110B-1, identifies at least one set of data from each of the radio and the voltage converter 110B which were obtained about the same time, e.g., within the second time window for example one millisecond or less, so that the DC electrical parameters received from the radio were substantially contemporaneously determined, e.g., measured, at the same time when the DC electrical parameters at an output of the voltage converter 110B were determined, e.g., measured. Optionally, this may be accomplished by having a constant DC power consumption level (and thus a constant radio input DC voltage level and a constant radio input direct current level) at the radio for a period of time, e.g., by sending no or a constant level of downlink traffic. Optionally, at least one of the at least one set of data is used compute a resistance of the radio power electrical conductors 110D as described elsewhere. Optionally, the network component may send the request to the voltage converter 110B, e.g., the processing system 110B-1, earlier, by a user defined period, e.g., 1 second, and then the request sent to the radio. This is done to increase likelihood that data is obtained, at the radio and the voltage converter 110B, e.g., the processing system 110B-1, at substantially the same time since management plane messages sent through the management system 114 and the fronthaul communications link 110G to the radio will likely have a lower latency than messages sent from the network component through the management system 114 and a packet communications, e.g., Internet Protocol (IP), communication link to the voltage converter 110B, e.g., the processing system 110B-1. Optionally, one or more of the communication links, illustrated with dotted lines, and communicatively coupling components in FIG. 1A may be implemented with packet communications, e.g., Internet Protocol (IP).

Optionally, in block 220J, a DC voltage level at the output of the voltage converter is determined. Optionally, the determined DC voltage level is based upon (a) the direct current level, e.g., measured by the measurement circuitry and/or the radio, (flowing through the output of the voltage converter, the radio power electrical conductors, and into the DC power input of the radio), (b) the determined resistance of the radio power electrical conductors, and (c) a target voltage level at the DC power input of the radio. Optionally, the DC voltage level provided at the output of the voltage converter at least in part compensates for a voltage drop in the radio power electrical conductors 110D and ensures that a DC voltage at the DC power input of the radio is at least one of: (i) not less than a minimum DC voltage level required for the radio to operate, e.g., be powered on, and (ii) not greater than a maximum DC voltage level above which the radio will not operate and/or will become damaged. The DC voltage level at a DC power input of the radio is the DC voltage level at the output of the voltage converter (e.g., at the output conductors) less the voltage drop in the radio power electrical conductors 110D. The DC voltage drop in the radio power electrical conductors 110D is a current flowing (from the output of the voltage converter, through the radio power electrical conductors, and into the DC power input of the radio) multiplied by the determined resistance of a radio power electrical conductors. Optionally, the output voltage of the voltage converter may be determined as a function: $V_O=(V_{RT}+(k*(R_{RPC}*I))+V_{OFFSET}$, where $V_{RT}$ is a target radio input DC operating voltage, k is a scaling factor (e.g., less than one), and $V_{OFFSET}$ is a positive or negative offset voltage. $V_{RT}$ may be a minimum, a maximum, a nominal, or another radio input DC operating voltage (e.g., between the minimum and maximum radio input DC operating voltage; for example, the target radio input DC operating voltage is between the nominal and maximum radio input DC operating voltages. I is a direct current determined to be flowing from (or through) the output of the voltage converter, determined to be flowing into the DC power input of the radio, or a function of both of the foregoing currents.

Optionally, the target DC voltage level at the DC power input of the radio is substantially constant (notwithstanding variations in current levels flowing from the output of the voltage converter, through the radio power electrical conductors, and into the DC power input of the radio). Optionally, the target DC voltage at a DC power input of radio is at least one of: (i) not less than a minimum DC input voltage level required for the radio to operate, e.g., be powered on, and (ii) not greater than a maximum DC input voltage level above which the radio will not operate and/or will become damaged. Also, optionally, the target DC voltage level at the DC power input of the radio is greater than a nominal DC input voltage level of the radio but less than the maximum DC input voltage level of the radio. Optionally, in block 220K, the voltage at the output of the voltage converter is set to the determined voltage level.

The processor systems (or processor circuitry), cloud computing systems (or cloud computing circuitry), and servers (server circuitry) disclosed herein may comprise state machines, neural network, and/or other types of computing systems. Such systems may comprise processing circuitry coupled to memory circuitry. The processing circuitry may include one or more microprocessors, microcontrollers, digital signal processing (DSP) elements, application-specific integrated circuits (ASICs), and/or field programmable gate arrays (FPGAs). The processor system may include or function with software programs, firmware, or other computer readable instructions, e.g., stored in the memory circuitry, for carrying out various process tasks, calculations, and control functions, used in the methods described herein. These instructions are typically tangibly embodied on any storage media (or computer readable medium) used for storage of computer readable instructions or data structures.

The memory circuitry can be implemented with any available storage media (or computer readable medium) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk-Read Only Memory (CD-ROM), DVDs, Blu-Ray discs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory.

Methods of the invention can be implemented in computer readable instructions, such as program modules or applications, which may be stored in the computer readable medium and executed by the processing circuitry. Generally, program modules or applications include routines, programs, objects, data components, data structures, algorithms, and the like, which perform particular tasks or implement particular abstract data types.

Databases as used herein may be either conventional databases or data storage formats of any type, e.g., data files. Although separate databases are recited herein, one or more of such databases may be combined.

EXAMPLE EMBODIMENTS

Example 1 includes a voltage converter, comprising: input conductors configured to receive a DC voltage; output conductors; measurement circuitry electrically coupled to the output conductors and configured to measure current level flowing through the output conductors; conversion circuitry comprising an input electrically coupled to the input conductors and an output electrically coupled to the output conductors; and processing circuitry configured to: receive, from a radio electrically connected to the output conductors by radio power electrical conductors, at least one DC radio power consumption level or at least one DC voltage level at a DC power input of the radio, and a corresponding time when each DC radio power consumption level or DC voltage level was determined; receive at least one DC voltage level across the output conductors of the voltage converter and a corresponding time when each DC voltage level was determined; obtain at least one of: (a) a direct current drawn by the DC power input of the radio and (b) a direct current flowing through the output conductors of the voltage converter; identify at least one set of (a) a radio DC power consumption level, a DC voltage level across the output conductors, and at least one of the direct current drawn by the DC power input of the radio and the direct current flowing through the output conductors, or (b) a DC voltage level at the DC power input of the radio, a DC voltage level across the output conductors, and at least one of the direct current drawn by the DC power input of the radio and the direct current flowing through the output conductors, wherein for each set a difference between each of the time corresponding to when the radio DC power consumption level or DC voltage level at the DC power input of the radio was determined, the time when the a DC voltage level across the output conductors was determined, and the times when the at least one of the direct current drawn by the DC power input of the radio and the direct current flowing through the output conductors were determined are within a time window; determine a resistance of the radio power electrical conductors using the identified at least one set; determine a DC voltage level, configured to be provided at the output conductors, based upon the determined resistance and a current level measured by the measurement circuitry; and set the DC voltage level at the output conductors to be equal to the determined DC voltage level.

Example 2 includes the voltage converter of Example 1, wherein the measurement circuitry is further configured to measure the DC voltage level at the output conductors, and the processing circuitry is further configured to receive the measured DC voltage level at the output conductors.

Example 3 includes the voltage converter of any of Examples 1-2, wherein the processing circuitry is further configured to request from the radio the at least one DC radio power consumption level or at least one DC voltage level at the DC power input of the radio.

Example 4 includes the voltage converter of Example 3, wherein the processing circuitry is further configured to request from the radio the at least one direct current level drawn by the DC power input of the radio.

Example 5 includes the voltage converter of any of Examples 1-4, wherein determining the resistance comprises determine an average of a set of resistances, and wherein each resistance of the set of resistances is determined from each identified set.

Example 6 includes the voltage converter of any of Examples 1-5, wherein the processing circuitry is further configured to receive time data with which to synchronize time, maintained by the processing circuitry, with time maintained by the radio.

Example 7 includes the voltage converter of any of Examples 1-6, wherein setting the DC voltage level at the output conductors comprises delivering the at least one DC voltage level at the DC power input of the radio that is substantially constant voltage regardless of the direct current drawn by the DC power input of the radio.

Example 8 includes the voltage converter of any of Examples 1-7, wherein setting the DC voltage level at the output conductors comprises delivering a DC voltage level at the DC power input of the radio is less than a maximum DC voltage rating of the radio and greater than a nominal DC voltage radio of the radio.

Example 9 includes the voltage converter of any of Examples 1-8, wherein the processing circuitry is further configured to determine at least one radio DC power consumption level, wherein each radio DC power consumption level is determined using the DC voltage level at the DC power input of the radio and at least one of: the direct current level flowing through the output conductors and the direct current level drawn by the DC power input of the radio.

Example 10 includes a method, comprising: receiving, from a radio electrically coupled to an output of a voltage converter by radio power electrical conductors, at least one DC radio power consumption level or at least one DC voltage level at a DC power input of the radio, and a corresponding time when each DC radio power consumption level or DC voltage level was determined; receiving, at least one DC voltage level across the output of the voltage converter and a corresponding time when each DC voltage level was determined; obtaining at least one of: (a) a direct current drawn by the DC power input of the radio and (b) a direct current flowing through the output of the voltage converter; identifying at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and determining a resistance of the radio power electrical conductors using the identified at least one set; wherein the determined resistance is configured to be used with a measured current flowing through the output of the voltage converter to determine a DC voltage level to be provided at an output of the voltage converter.

Example 11 includes the method of Example 10, further comprising determining the DC voltage level configured to be provided at the output of the voltage converter.

Example 12 includes the method of any of Examples 10-11, further comprising requesting from the radio the at least one DC radio power consumption level or at least one DC voltage level at the DC power input of the radio.

Example 13 includes the method of Example 12, further comprising requesting from the radio the at least one direct current level drawn by the DC power input of the radio.

Example 14 includes the method of any of Examples 10-13, wherein determining the resistance comprises determining an average of a set of resistances, and wherein each resistance of the set of resistances is determined from each identified set.

Example 15 includes the method of any of Examples 10-14, further comprising determining at least one radio DC power consumption level, wherein each radio DC power consumption level is determined using the DC voltage level at the DC power input of the radio and at least one of: the direct current level flowing through the output conductors and the direct current level drawn by the DC power input of the radio.

Example 16 includes the method of any of Examples 10-15, further comprising receiving time data with which to synchronize time, maintained by the voltage converter, with time maintained by the radio.

Example 17 includes a program product comprising a processor readable non-transitory medium on which program instructions are embodied, wherein the program instructions are configured, when executed by at least one programmable processor, to cause the at least one programmable processor to: receive, from a radio electrically coupled to an output of a voltage converter by radio power electrical conductors, at least one DC radio power consumption or at least one DC voltage level at a DC power input of the radio, and a corresponding time when each DC radio power consumption level or DC voltage level was determined; receive, at least one DC voltage level at the output of the voltage converter and a corresponding time when each corresponding time was determined; obtain at least one of: (a) a direct current drawn by the DC power input of the radio and (b) a direct current flowing through the output of the voltage converter; identify at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and determine a resistance of the radio power electrical conductors using the identified at least one set, wherein the determined resistance is configured to be used with a measured current flowing through the output of the voltage converter to determine a DC voltage level to be provided at an output of the voltage converter.

Example 18 includes the program product of Example 17, wherein the program instructions are configured, when executed by at least one programmable processor, to further cause the at least one programmable processor to determine the DC voltage level configured to be provided at the output of the voltage converter.

Example 19 includes the program product of any of Examples 17-18, wherein the program instructions are configured, when executed by at least one programmable processor, to further cause the at least one programmable processor to request from the radio the at least one DC radio power consumption level or at least one DC voltage level at the DC power input of the radio.

Example 20 includes the program product of any of Examples 17-19, wherein the program instructions are configured, when executed by at least one programmable processor, to further cause the at least one programmable processor to request the at least one DC radio power consumption level or at least one DC voltage level at the DC power input of the radio.

Example 21 includes the program product of Example 20, wherein the program instructions are configured, when executed by at least one programmable processor, to further cause the at least one programmable processor to request from the radio the at least one direct current level drawn by the DC power input of the radio.

Example 22 includes the program product of any of Examples 17-21, wherein determining the resistance comprises determining an average of a set of resistances, and wherein each resistance of the set of resistances is determined from each identified set.

Example 23 includes the program product of any of Examples 17-22, wherein the program instructions are configured, when executed by at least one programmable processor, to determine at least one radio DC power consumption level, wherein each radio DC power consumption level is determined using the DC voltage level at the DC power input of the radio and at least one of: the direct current level flowing through the output conductors and the direct current level drawn by the DC power input of the radio.

Example 24 includes the program product of any of Examples 17-23, wherein the program instructions are configured, when executed by at least one programmable processor, to further cause the at least one programmable processor to receive time data with which to synchronize time, maintained by the voltage converter, with time maintained by the radio.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A voltage converter, comprising:
input conductors configured to receive a DC voltage;
output conductors;
measurement circuitry electrically coupled to the output conductors and configured to measure current level flowing through the output conductors;
conversion circuitry comprising an input electrically coupled to the input conductors and an output electrically coupled to the output conductors; and
processing circuitry configured to:
receive, from a radio electrically connected to the output conductors by radio power electrical conductors, at least one DC radio power consumption level or at least one DC voltage level at a DC power input of the radio, and a corresponding time when each DC radio power consumption level or DC voltage level was determined;
receive at least one DC voltage level across the output conductors of the voltage converter and a corresponding time when each DC voltage level was determined;
obtain at least one of: (a) a direct current drawn by the DC power input of the radio and (b) a direct current flowing through the output conductors of the voltage converter;
identify at least one set of (a) a radio DC power consumption level, a DC voltage level across the output conductors, and at least one of the direct current drawn by the DC power input of the radio and the direct current flowing through the output conductors, or (b) a DC voltage level at the DC power input of the radio, a DC voltage level across the output conductors, and at least one of the direct current drawn by the DC power input of the radio and the direct current flowing through the output conductors, wherein for each set a difference between each of the time corresponding to when the radio DC power consumption level or DC voltage level at the DC power input of the radio was determined, the time when the a DC voltage level across the output conductors was determined, and the times when the at least one of the direct current drawn by the DC power input of the radio and the direct current flowing through the output conductors were determined are within a time window;
determine a resistance of the radio power electrical conductors using the identified at least one set;
determine a DC voltage level, configured to be provided at the output conductors, based upon the determined resistance and a current level measured by the measurement circuitry; and
set the DC voltage level at the output conductors to be equal to the determined DC voltage level.

2. The voltage converter of claim 1, wherein the measurement circuitry is further configured to measure the DC voltage level at the output conductors, and the processing circuitry is further configured to receive the measured DC voltage level at the output conductors.

3. The voltage converter of claim 1, wherein the processing circuitry is further configured to request from the radio the at least one DC radio power consumption level or at least one DC voltage level at the DC power input of the radio.

4. The voltage converter of claim 3, wherein the processing circuitry is further configured to request from the radio the at least one direct current level drawn by the DC power input of the radio.

5. The voltage converter of claim 1, wherein determining the resistance comprises determine an average of a set of resistances, and wherein each resistance of the set of resistances is determined from each identified set.

6. The voltage converter of claim 1, wherein the processing circuitry is further configured to receive time data with which to synchronize time, maintained by the processing circuitry, with time maintained by the radio.

7. The voltage converter of claim 1, wherein setting the DC voltage level at the output conductors comprises delivering the at least one DC voltage level at the DC power input of the radio that is substantially constant voltage regardless of the direct current drawn by the DC power input of the radio.

8. The voltage converter of claim 1, wherein setting the DC voltage level at the output conductors comprises delivering a DC voltage level at the DC power input of the radio is less than a maximum DC voltage rating of the radio and greater than a nominal DC voltage radio of the radio.

9. The voltage converter of claim 1, wherein the processing circuitry is further configured to determine at least one radio DC power consumption level, wherein each radio DC power consumption level is determined using the DC voltage level at the DC power input of the radio and at least one of: the direct current level flowing through the output conductors and the direct current level drawn by the DC power input of the radio.

10. A method, comprising:
  receiving, from a radio electrically coupled to an output of a voltage converter by radio power electrical conductors, at least one DC radio power consumption level or at least one DC voltage level at a DC power input of the radio, and a corresponding time when each DC radio power consumption level or DC voltage level was determined;
  receiving, at least one DC voltage level across the output of the voltage converter and a corresponding time when each DC voltage level was determined;
  obtaining at least one of: (a) a direct current drawn by the DC power input of the radio and (b) a direct current flowing through the output of the voltage converter;
  identifying at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and
  determining a resistance of the radio power electrical conductors using the identified at least one set;
  wherein the determined resistance is configured to be used with a measured current flowing through the output of the voltage converter to determine a DC voltage level to be provided at an output of the voltage converter.

11. The method of claim 10, further comprising determining the DC voltage level configured to be provided at the output of the voltage converter.

12. The method of claim 10, further comprising requesting from the radio the at least one DC radio power consumption level or at least one DC voltage level at the DC power input of the radio.

13. The method of claim 12, further comprising requesting from the radio the at least one direct current level drawn by the DC power input of the radio.

14. The method of claim 10, wherein determining the resistance comprises determining an average of a set of resistances, and wherein each resistance of the set of resistances is determined from each identified set.

15. The method of claim 10, further comprising determining at least one radio DC power consumption level, wherein each radio DC power consumption level is determined using the DC voltage level at the DC power input of the radio and at least one of: the direct current level flowing through the output conductors and the direct current level drawn by the DC power input of the radio.

16. The method of claim 10, further comprising receiving time data with which to synchronize time, maintained by the voltage converter, with time maintained by the radio.

17. A program product comprising a processor readable non-transitory medium on which program instructions are embodied, wherein the program instructions are configured, when executed by at least one programmable processor, to cause the at least one programmable processor to:
  receive, from a radio electrically coupled to an output of a voltage converter by radio power electrical conductors, at least one DC radio power consumption or at least one DC voltage level at a DC power input of the radio, and a corresponding time when each DC radio power consumption level or DC voltage level was determined;
  receive, at least one DC voltage level at the output of the voltage converter and a corresponding time when each corresponding time was determined;
  obtain at least one of: (a) a direct current drawn by the DC power input of the radio and (b) a direct current flowing through the output of the voltage converter;
  identify at least one set of (a) a radio DC power consumption level, a DC voltage level across the output of the voltage converter, and at least one of the direct current drawn by the DC power input of the radio and the direct current flowing through the output of the voltage converter, or (b) a DC voltage level at the DC power input of the radio, a DC voltage level across the output conductors, and at least one of the direct current drawn by the DC power input of the radio and the direct current flowing through the output of the voltage converter, wherein for each set a difference between each of the time corresponding to when the radio DC power consumption level or DC voltage level at the DC power input of the radio was determined, the time when the a DC voltage level across the output of the voltage converter was determined, and the times when the at least one of the direct current drawn by the DC power input of the radio and the direct current flowing through the output of the voltage converter were determined are within a time window; and
  determine a resistance of the radio power electrical conductors using the identified at least one set, wherein the determined resistance is configured to be used with a measured current flowing through the output of the voltage converter to determine a DC voltage level to be provided at an output of the voltage converter.

18. The program product of claim 17, wherein the program instructions are configured, when executed by at least one programmable processor, to further cause the at least one programmable processor to determine the DC voltage level configured to be provided at the output of the voltage converter.

19. The program product of claim 17, wherein the program instructions are configured, when executed by at least one programmable processor, to further cause the at least one programmable processor to request from the radio the at least one DC radio power consumption level or at least one DC voltage level at the DC power input of the radio.

20. The program product of claim 17, wherein the program instructions are configured, when executed by at least one programmable processor, to further cause the at least one programmable processor to request the at least one DC radio power consumption level or at least one DC voltage level at the DC power input of the radio.

21. The program product of claim 20, wherein the program instructions are configured, when executed by at least one programmable processor, to further cause the at least one programmable processor to request from the radio the at least one direct current level drawn by the DC power input of the radio.

22. The program product of claim 17, wherein determining the resistance comprises determining an average of a set of resistances, and wherein each resistance of the set of resistances is determined from each identified set.

23. The program product of claim 17, wherein the program instructions are configured, when executed by at least one programmable processor, to determine at least one radio DC power consumption level, wherein each radio DC power consumption level is determined using the DC voltage level at the DC power input of the radio and at least one of: the direct current level flowing through the output conductors and the direct current level drawn by the DC power input of the radio.

24. The program product of claim 17, wherein the program instructions are configured, when executed by at least one programmable processor, to further cause the at least one programmable processor to receive time data with which to synchronize time, maintained by the voltage converter, with time maintained by the radio.

* * * * *